(12) United States Patent
Du et al.

(10) Patent No.: US 11,361,694 B2
(45) Date of Patent: Jun. 14, 2022

(54) SHIFT REGISTER, GATE DRIVING CIRCUIT, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Ruifang Du, Beijing (CN); Ruiying Yang, Beijing (CN); Lingjuan Liu, Beijing (CN); Xiaoye Ma, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 65 days.

(21) Appl. No.: 16/640,284

(22) PCT Filed: May 10, 2019

(86) PCT No.: PCT/CN2019/086310
§ 371 (c)(1),
(2) Date: Feb. 19, 2020

(87) PCT Pub. No.: WO2019/223550
PCT Pub. Date: Nov. 28, 2019

(65) Prior Publication Data
US 2021/0005124 A1 Jan. 7, 2021

(30) Foreign Application Priority Data
May 25, 2018 (CN) .......................... 201810545723.8

(51) Int. Cl.
*G11C 19/28* (2006.01)
*G09G 3/36* (2006.01)
*G09G 3/20* (2006.01)

(52) U.S. Cl.
CPC ............. *G09G 3/20* (2013.01); *G11C 19/287* (2013.01); *G09G 3/3674* (2013.01);
(Continued)

(58) Field of Classification Search
CPC ............. G09G 3/20; G09G 2310/0286; G09G 2310/08; G09G 3/3674; G09G 2330/021;
(Continued)

(56) References Cited

U.S. PATENT DOCUMENTS

2012/0098804 A1* 4/2012 Ohhashi ............... G11C 19/184
345/204
2017/0011699 A1* 1/2017 Wang ..................... G11C 19/28
(Continued)

FOREIGN PATENT DOCUMENTS

CN 202258264 U 5/2012
CN 104700812 A 6/2015
(Continued)

*Primary Examiner* — Patrick N Edouard
*Assistant Examiner* — Douglas M Wilson
(74) *Attorney, Agent, or Firm* — The Webb Law Firm

(57) ABSTRACT

Embodiments of the present disclosure provide a shift register, a gate driving circuit, and a display apparatus. The shift register comprises a power consumption-reducing sub-circuit and an output sub-circuit; wherein: the power consumption-reducing sub-circuit is connected to a clock signal terminal, a control terminal, and the output sub-circuit, the power consumption-reducing sub-circuit is used to output a signal of the clock signal terminal to the output sub-circuit under the control of the control terminal; the output sub-circuit is connected to the clock signal terminal through the power consumption-reducing sub-circuit and is also connected to an output terminal and a pull-up node, the output sub-circuit is used to output an output signal of the power consumption-reducing sub-circuit to the output terminal under the control of the pull-up node.

19 Claims, 9 Drawing Sheets

(52) U.S. Cl.
CPC . *G09G 2310/0286* (2013.01); *G09G 2310/08* (2013.01); *G09G 2330/021* (2013.01); *G11C 19/28* (2013.01)

(58) Field of Classification Search
CPC .................. G09G 3/36; G09G 3/3677; G09G 2300/0408; G11C 19/287; G11C 19/28; H03K 3/012
See application file for complete search history.

(56) References Cited

U.S. PATENT DOCUMENTS

| | | |
|---|---|---|
| 2018/0108312 A1 | 4/2018 | Aoki |
| 2018/0166039 A1 | 6/2018 | Gong |
| 2018/0174659 A1 | 6/2018 | Shao et al. |
| 2020/0160805 A1* | 5/2020 | Hong .................. G09G 3/3696 |

FOREIGN PATENT DOCUMENTS

| | | |
|---|---|---|
| CN | 105702297 A | 6/2016 |
| CN | 105810165 A | 7/2016 |
| CN | 106782664 A | 5/2017 |
| CN | 107464521 A | 12/2017 |
| CN | 107958656 A | 4/2018 |
| CN | 108399906 A | 8/2018 |

* cited by examiner

SHIFT REGISTER, GATE DRIVING CIRCUIT, AND DISPLAY APPARATUS

CROSS-REFERENCE TO RELATED APPLICATIONS

This application is a U.S. National Stage Application under 35 U.S.C. § 371 of International Patent Application No. PCT/CN2019/086310, filed on May 10, 2019, which claims the priority to Chinese Patent Application No. 201810545723.8, filed on May 25, 2018, the content of each of which is incorporated herein by reference for all purposes.

TECHNICAL FIELD

The present disclosure relates to a shift register, a gate driving circuit, and a display apparatus.

BACKGROUND

Related gate drivers usually adopt a GOA (Gate Driver on Array) design to integrate a TFT (Thin Film Transistor) gate switching circuit onto the peripheral region for forming a gate driving circuit. Since this technology has advantages of reducing costs, increasing the yield of module processes, facilitating the implementation of narrow bezels and so on, now more and more displays, e.g., liquid crystal displays (LCD) are developed using this technology.

There is a demand for improved gate driving circuits.

SUMMARY

Embodiments of the present disclosure provide a shift register, a gate driving circuit, and a display apparatus.

A first aspect of the embodiments of the present disclosure provides a shift register comprising a power consumption-reducing sub-circuit and an output sub-circuit; the power consumption-reducing sub-circuit is connected to a clock signal terminal, a control terminal, and the output sub-circuit, the power consumption-reducing sub-circuit is configured to output a signal of the clock signal terminal to the output sub-circuit under the control of the control terminal; the output sub-circuit is connected to the clock signal terminal through the power consumption-reducing sub-circuit and is also connected to an output terminal and a pull-up node, the output sub-circuit is configured to output an output signal of the power consumption-reducing sub-circuit to the output terminal under the control of the pull-up node.

In an example, the shift register further comprises an input sub-circuit, a pull-down control sub-circuit, a pull-down sub-circuit, and a reset sub-circuit; the input sub-circuit is connected to an input terminal and the pull-up node, the input sub-circuit is configured to output a voltage of the input terminal to the pull-up node under the control of the input terminal; the pull-down control sub-circuit is connected to a first voltage terminal, a second voltage terminal, the pull-up node, and a pull-down node, the pull-down control sub-circuit is configured to output a voltage of the first voltage terminal to the pull-down node under the control of the first voltage terminal, or is configured to output a voltage of the second voltage terminal to the pull-down node under the control of the pull-up node; the pull-down sub-circuit is connected to the pull-up node, the pull-down node, the output terminal, and the second voltage terminal, the pull-down sub-circuit is configured to output a voltage of the second voltage terminal to the pull-up node and the output terminal under the control of the pull-down node; the reset sub-circuit is connected to a reset signal terminal, the second voltage terminal, and the pull-up node, the reset sub-circuit is configured to output a voltage of the second voltage terminal to the pull-up node under the control of the reset signal terminal.

In an example, the reset sub-circuit is further connected to the output terminal, and is further configured to output a voltage of the second voltage terminal to the output terminal under the control of the reset signal terminal.

In an example, the power consumption-reducing sub-circuit comprises a first transistor, a gate of the first transistor is connected to the control terminal, a first electrode of the first transistor is connected to the clock signal terminal, a second electrode of the first transistor is connected to the output sub-circuit.

In an example, the output sub-circuit comprises a second transistor, a gate of the second transistor is connected to the pull-up node, a first electrode of the second transistor is connected to the power consumption-reducing sub-circuit, a second electrode of the second transistor is connected to the output terminal.

In an example, the input sub-circuit comprises a third transistor, a gate and a first electrode of the third transistor are connected to the input terminal, a second electrode of the third transistor is connected to the pull-up node.

In an example, the pull-down control sub-circuit comprises a fourth transistor, a fifth transistor, a sixth transistor, and a seventh transistor; a gate and a first electrode of the fourth transistor are connected to the first voltage terminal, a second electrode of the fourth transistor is connected to a gate of the fifth transistor and a first electrode of the sixth transistor; a first electrode of the fifth transistor is connected to the first voltage terminal, a second electrode of the fifth transistor is connected to the pull-down node and a first electrode of the seventh transistor; a gate of the sixth transistor is connected to the pull-up node, a second electrode of the sixth transistor is connected to the second voltage terminal; a gate of the seventh transistor is connected to the pull-up node, a second electrode of the seventh transistor is connected to the second voltage terminal.

In an example, the pull-down sub-circuit comprises an eighth transistor and a ninth transistor, a gate of the eighth transistor is connected to the pull-down node, a first electrode of the eighth transistor is connected to the pull-up node, a second electrode of the eighth transistor is connected to the second voltage terminal; a gate of the ninth transistor is connected to the pull-down node, a first electrode of the ninth transistor is connected to the output terminal, a second electrode of the ninth transistor is connected to the second voltage terminal.

In an example, the reset sub-circuit comprises a tenth transistor, a gate of the tenth transistor is connected to the reset signal terminal, a first electrode of the tenth transistor is connected to the pull-up node, a second electrode of the tenth transistor is connected to the second voltage terminal.

In an example, the reset sub-circuit comprises an eleventh transistor, a gate of the eleventh transistor is connected to the reset signal terminal, a first electrode of the eleventh transistor is connected to the output terminal, a second electrode of the eleventh transistor is connected to the second voltage terminal.

A second aspect of the embodiments of the present disclosure provides a shift register comprising a first transistor, a second transistor, and a voltage-stabilizing capacitance; a gate of the first transistor is connected to a control terminal, a first electrode of the first transistor is connected to a clock signal terminal, a second electrode of the first transistor is connected to a first electrode of the second transistor; a gate of the second transistor is connected to a pull-up node, a second electrode of the second transistor is connected to an output terminal; an end of the voltage-stabilizing capacitance is connected to the pull-up node, another end of the voltage-stabilizing capacitance is connected to the output terminal.

In an example, the shift register further comprises a third transistor, a fourth transistor, a fifth transistor, a sixth transistor, a seventh transistor, an eighth transistor, a ninth transistor, and a tenth transistor; a gate and a first electrode of the third transistor are connected to an input terminal, a second electrode of the third transistor is connected to the pull-up node; a gate and a first electrode of the fourth transistor are connected to a first voltage terminal, a second electrode of the fourth transistor is connected to a gate of the fifth transistor and a first electrode of the sixth transistor; a first electrode of the fifth transistor is connected to the first voltage terminal, a second electrode of the fifth transistor is connected to a pull-down node and a first electrode of the seventh transistor; a gate of the sixth transistor is connected to the pull-up node, a second electrode of the sixth transistor is connected to a second voltage terminal; a gate of the seventh transistor is connected to the pull-up node, a second electrode of the seventh transistor is connected to the second voltage terminal; a gate of the eighth transistor is connected to the pull-down node, a first electrode of the eighth transistor is connected to of the pull-up node, a second electrode of the eighth transistor is connected to the second voltage terminal; a gate of the ninth transistor is connected to the pull-down node, a first electrode of the ninth transistor is connected to the output terminal, a second electrode of the ninth transistor is connected to the second voltage terminal; a gate of the tenth transistor is connected to a reset signal terminal, a first electrode of the tenth transistor is connected to the pull-up node, a second electrode of the tenth transistor is connected to the second voltage terminal.

In an example, the shift register further comprises an eleventh transistor, a gate of the eleventh transistor is connected to the reset signal terminal, a first electrode of the eleventh transistor is connected to the output terminal, a second electrode of the eleventh transistor is connected to the second voltage terminal.

A third aspect of the embodiments of the present disclosure provides a gate driving circuit comprising a plurality of the shift registers according to the first or second aspect in cascade; a control terminal of at least one stage of the shift registers is connected to a first control signal terminal; a control terminal of at least one stage of the shift registers is connected to a second control signal terminal.

In an example, in a case where the shift register comprises an input sub-circuit, a pull-down control sub-circuit, a pull-down sub-circuit, and a reset sub-circuit, input terminals of 1st through (N/2)th-stage shift registers are connected to a first signal terminal, except for the 1st through (N/2)th-stage shift registers, an input terminal of an Mth-stage shift register is connected to an output terminal of an (M−N/2)th-stage shift register; except for the last N/2 stages of shift registers, a reset signal terminal of the Mth-stage shift register is connected to an output terminal of an (M+N/2)th-stage shift register, reset signal terminals of the last N/2 stages of shift registers are connected to a second signal terminal, wherein N represents the number of clock signals within a clock period, the clock signals being clock signals input to the gate driving circuit, N is a positive even number, M is a positive integer.

In an example, control terminals of individual stages of shift registers of an upper half of the gate driving circuit are connected to the first control signal terminal, control terminals of individual stages of shift registers of a lower half of the gate driving circuit are connected to the second control signal terminal.

A fourth aspect of the embodiments of the present disclosure provides a display apparatus comprising the gate driving circuit according to the third aspect.

BRIEF DESCRIPTION OF THE DRAWINGS

To describe the technical solutions in the embodiments of the present disclosure or the related art more clearly, the accompanying drawings required to be used in the description of the embodiments or the related art will be briefly introduced in the following. Evidently, the accompanying drawings in the following description are only some embodiments of the present disclosure, and persons of ordinary skill in the art may also obtain other drawings from these accompanying drawings without creative efforts.

DETAILED DESCRIPTION

The technical solutions in the embodiments of the present disclosure are clearly and completely described in the following with reference to the accompanying drawings in the embodiments of the present disclosure. Evidently, the described embodiments are only a part rather than all of the embodiments of the present disclosure. Based on the embodiments of the present disclosure, all other embodiments obtained by persons of ordinary skill in the art without creative effects shall fall within the protection scope of the present disclosure.

In a related gate driving circuit, a clock signal line is directly connected to a source of an output transistor, a pull-up node is connected to a gate of the output transistor, an output terminal is connected to a drain of the output transistor, i.e., the drain of the output transistor is directly connected to a gate line of a display screen. Since a loading on the gate line is generally large, the output transistor is generally a large-size (width-to-length ratio) transistor with a width (W) being substantially thousands of micrometers or even tens of thousands of micrometers, and thus a gate-source capacitance $C_{gs}^2$ of the output transistor is also large. Taking a clock signal of the gate driving circuit being 4CLK and a resolution of a display being 2m*2n for example, a capacitance that each clock signal line is connected with due to the output transistor is $2n \times C_{gs}^2/4$. Additionally, when the clock signal is 4CLK, a period of the clock signal is 4H, thus a frequency of the clock signal is ¼H. Since a dynamic power consumption of the clock signal line may be represented as $P=f_{ck} \times C_{ck} \times V_{ck}^2$, i.e., the dynamic power consumption P of the clock signal line is proportional to a frequency $f_{ck}$ of the clock signal and a capacitance $C_{ck}$ on the clock signal line, the power consumption of the related gate driving circuit is relatively large.

The embodiments of the present disclosure provide a shift register, a gate driving circuit, and a display apparatus for reducing power consumption of the gate driving circuit by decreasing a capacitance on a clock signal line.

Figure 1:
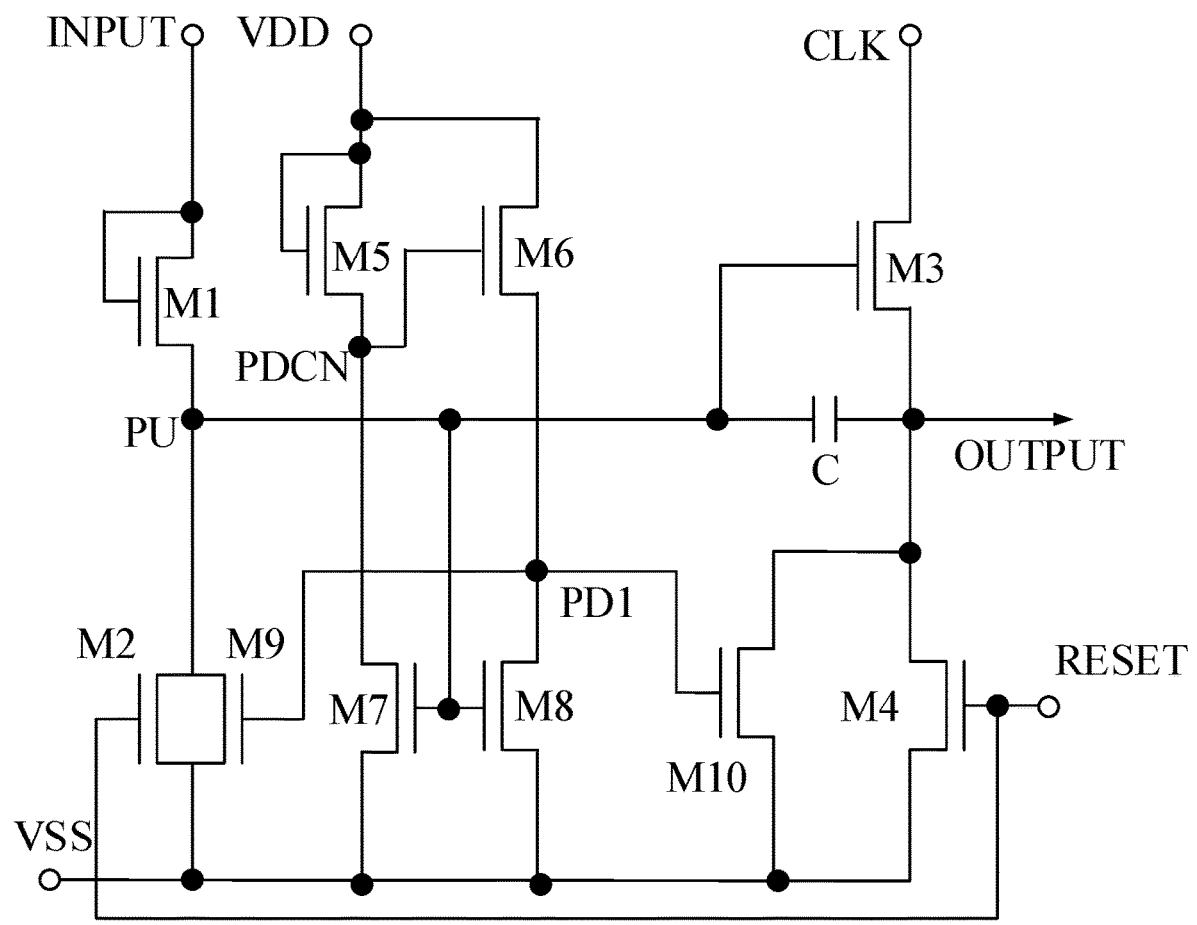
FIG. 1 is a structural diagram of a related shift register.
Figure 2:
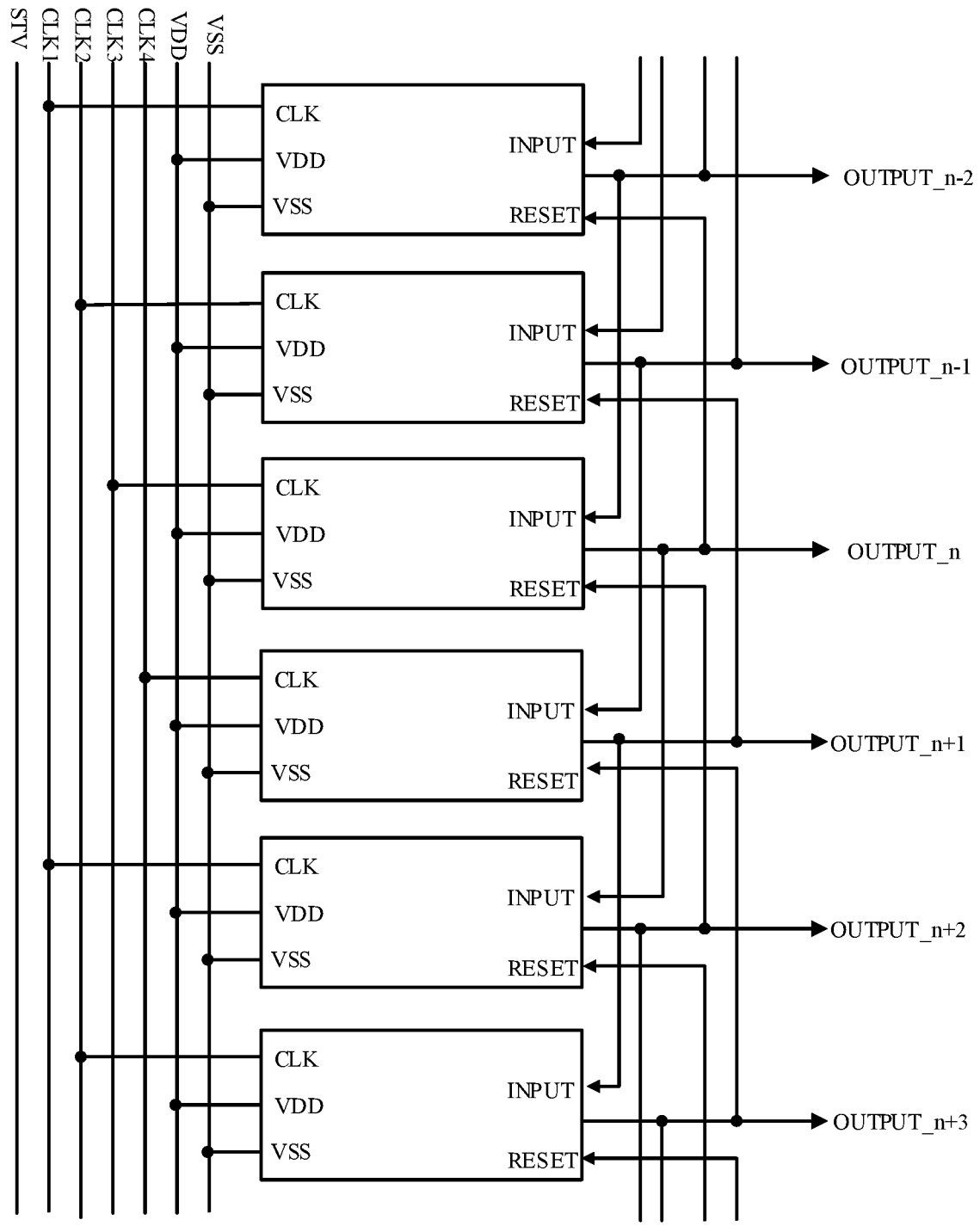
FIG. 2 is a structural diagram of a gate driving circuit formed by a plurality of the shift registers shown in FIG. 1 in cascade.
Figure 3:
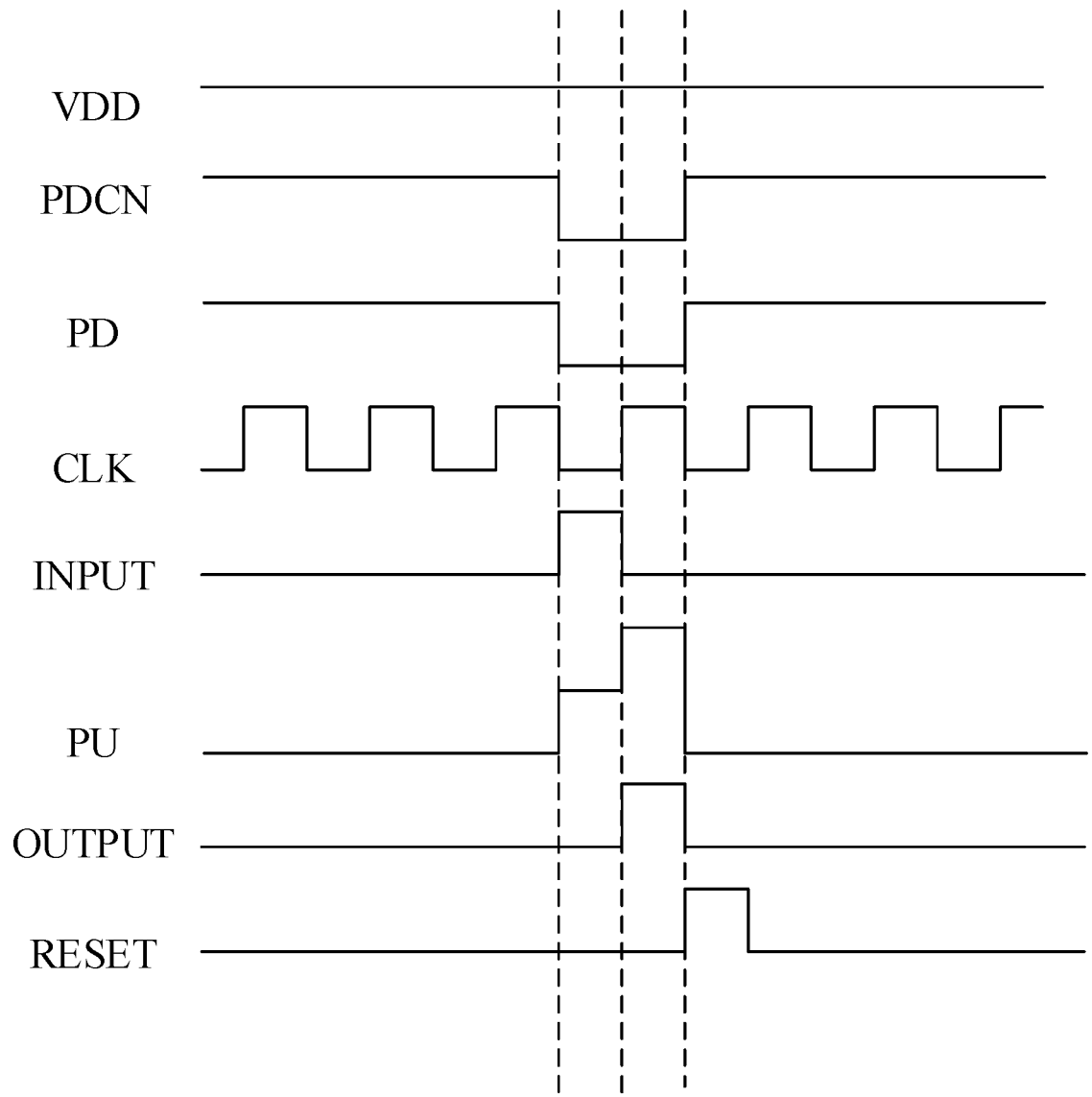
FIG. 3 is a timing control diagram of the shift register shown in FIG. 1.

FIG. 1 is a structural diagram of a related shift register, FIG. 2 is a structural diagram of a gate driving circuit formed by a plurality of the shift registers shown in FIG. 1 in cascade, and FIG. 3 is a timing control diagram of the shift register shown in FIG. 1. A transistor M3 is an output transistor. It can be seen that a clock signal line CLK is directly connected to a source of the transistor M3, a pull-up node PU is connected to a gate of the transistor M3, an output terminal is connected to a drain of the transistor M3. With reference to the Background, the gate driving circuit shown in FIG. 2 has a relatively large power consumption. To solve this problem, the embodiments of the present disclosure provide the following technical solutions.

Figure 4:
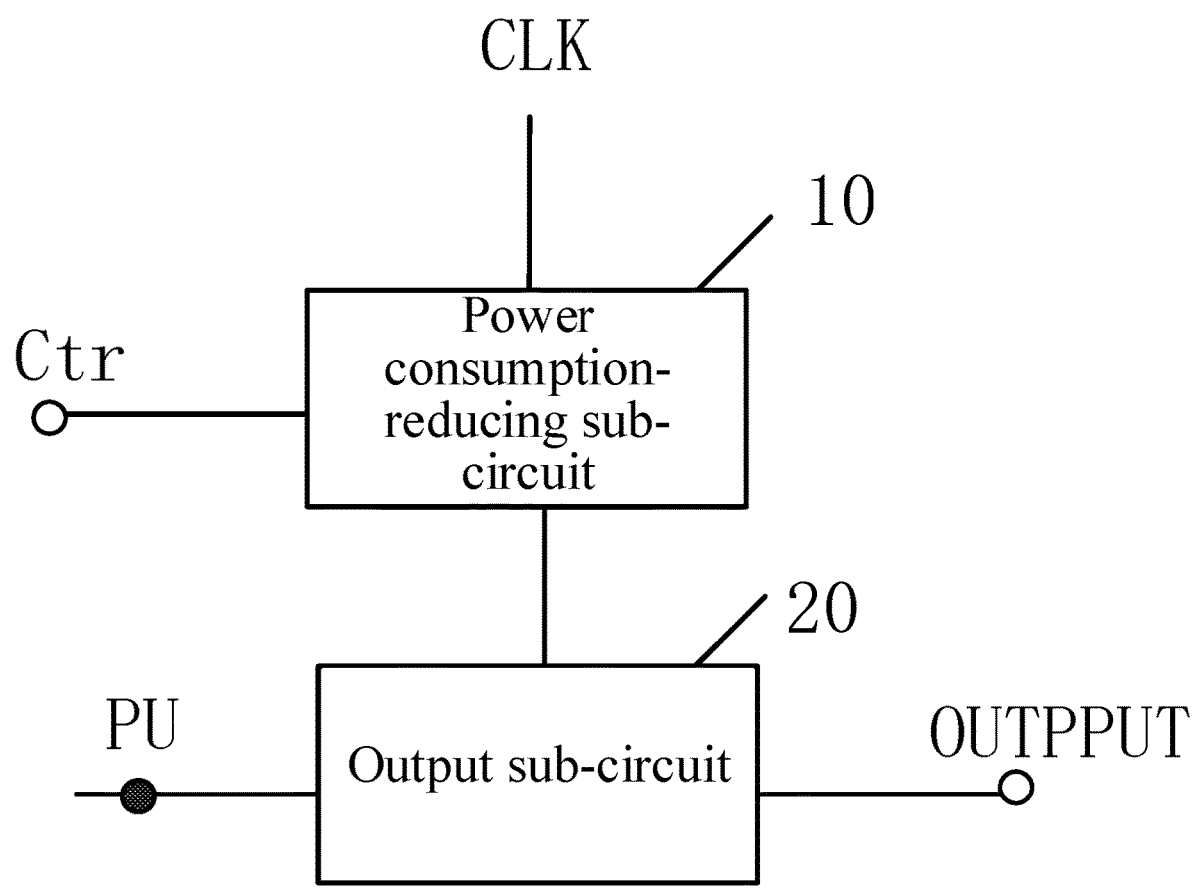
FIG. 4 is a structural diagram of a shift register provided by the embodiments of the present disclosure.

The embodiments of the present disclosure provide a shift register comprising a power consumption-reducing sub-circuit 10 and an output sub-circuit 20 as shown in FIG. 4.

As shown in FIG. 4, the power consumption-reducing sub-circuit 10 is connected to a clock signal terminal CLK, a control terminal Ctr, and the output sub-circuit 20, the power consumption-reducing sub-circuit 10 is configured to output a signal of the clock signal terminal CLK to the output sub-circuit 20 under the control of the control terminal Ctr.

The output sub-circuit 20 is connected to the clock signal terminal CLK through the power consumption-reducing sub-circuit 10, the output sub-circuit 20 is also connected to an output terminal OUTPUT and a pull-up node PU, the output sub-circuit 20 is configured to output an output signal of the power consumption-reducing sub-circuit 10 to the output terminal OUTPUT under the control of the pull-up node PU.

In the shift register provided by the embodiments of the present disclosure, the output sub-circuit 20 is connected to the clock signal terminal CLK through the power consumption-reducing sub-circuit 10 and the power consumption-reducing sub-circuit 10 is not connected with the output terminal OUTPUT, therefore, a size of a transistor constituting the power consumption-reducing sub-circuit 10 may be relatively small compared to that of a transistor constituting the output sub-circuit 20, and thus a gate-source capacitance $C_{gs}$ corresponding to the transistor constituting the power consumption-reducing sub-circuit 10 may be relatively small, such that a capacitance $C_{ck}$ on the clock signal line may be reduced; and according to a dynamic power consumption $P=f_{ck} \times C_{ck} \times V_{ck}^2$ of the clock signal line, it is clear that a reduced capacitance $C_{ck}$ on the clock signal line may result in a reduced dynamic power consumption P of the clock signal line, and then when this shift register is used in cascade to form a gate driving circuit, power consumption of the gate driving circuit may be reduced.

It should be noted that taking a clock signal of the gate driving circuit being 4CLK and a resolution of a display being 2m*2n for example, in the embodiments of the present disclosure, a capacitance of each clock signal line is $X \times C_{gs}^1/4 + Y \times C_{gs}^2/4$, wherein $C_{gs}^1$ is a gate-source capacitance of the transistor constituting the power consumption-reducing sub-circuit 10, $C_{gs}^2$ is a gate-source capacitance of the transistor constituting the output sub-circuit 20, X is a number of shift registers in which a clock signal may be output into the output sub-circuit 20 through the power consumption-reducing sub-circuit 10, Y is a number of shift registers in which a clock signal may not be output into the output sub-circuit 20 through the power consumption-reducing sub-circuit 10. Combined with the foregoing, $C_{gs}^1$ is much smaller than $C_{gs}^2$, and then the dynamic power consumption P of the clock signal line of the gate driving circuit formed by using the shift registers in cascade is much smaller than that of the related gate driving circuit. Meanwhile, a signal delay due to a loading of the clock signal line may also be greatly reduced when transferring the clock signal.

In the embodiments of the present disclosure, it may be controlled whether to output the clock signal of the clock signal line to the output sub-circuit 20 through the power consumption-reducing sub-circuit 10 by selecting a control signal of the control terminal Ctr. Since a frequency of an input signal of the control terminal Ctr is much smaller than a frequency of the clock signal CLK, the dynamic power consumption P of the clock signal line may be further reduced.

Figure 5:
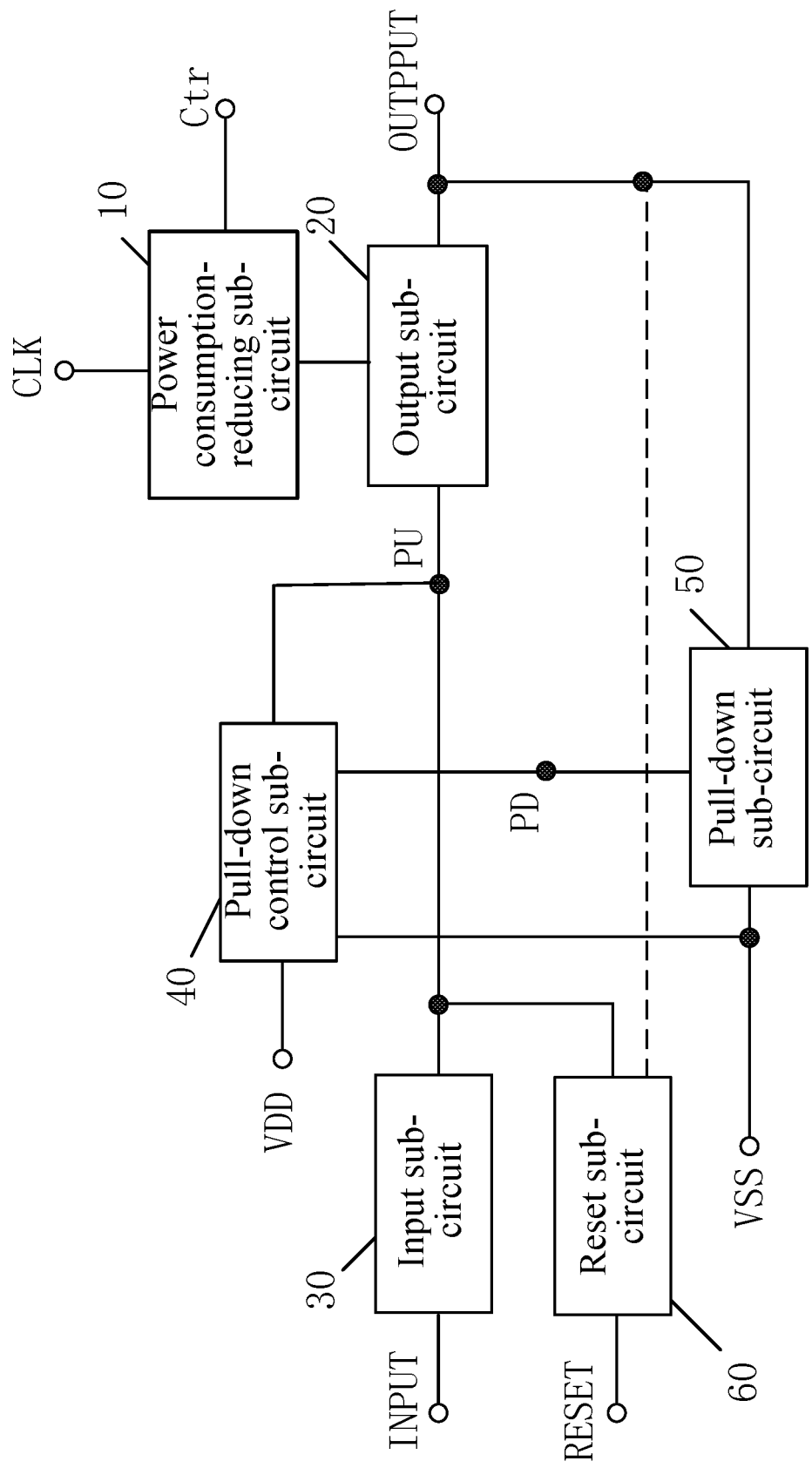
FIG. 5 is a structural diagram of the shift register shown in FIG. 4 with an input sub-circuit, a pull-down control sub-circuit, a pull-down sub-circuit, and a reset sub-circuit.

In an example, the shift register provided by the embodiments of the present disclosure may further comprise an input sub-circuit 30, a pull-down control sub-circuit 40, a pull-down sub-circuit 50, and a reset sub-circuit 60, as shown in FIG. 5.

As shown in FIG. 5, the input sub-circuit 30 is connected to an input terminal INPUT and the pull-up node PU, the input sub-circuit 30 is configured to output a voltage of the input terminal INPUT to the pull-up node PU under the control of the input terminal INPUT.

The pull-down control sub-circuit 40 is connected to a first voltage terminal VDD, a second voltage terminal VSS, the pull-up node PU, and a pull-down node PD, the pull-down control sub-circuit 40 is configured to output a voltage of the first voltage terminal VDD to the pull-down node PD under the control of the first voltage terminal VDD, or is configured to output a voltage of the second voltage terminal VSS to the pull-down node PD under the control of the pull-up node PU.

The pull-down sub-circuit 50 is connected to the pull-up node PU, the pull-down node PD, the output terminal OUTPUT, and the second voltage terminal VSS, the pull-down sub-circuit 50 is configured to output a voltage of the second voltage terminal VSS to the pull-up node PU and the output terminal OUTPUT under the control of the pull-down node PD.

The reset sub-circuit 60 is connected to a reset signal terminal RESET, the second voltage terminal VSS, and the pull-up node PU, the reset sub-circuit 60 is configured to output a voltage of the second voltage terminal VSS to the pull-up node PU under the control of the reset signal terminal RESET.

In an example, the reset sub-circuit 60 is further connected to the output terminal OUTPUT, the reset sub-circuit 60 is further configured to output a voltage of the second voltage terminal VSS to the output terminal OUTPUT under the control of the reset signal terminal RESET.

A circuit structure of the shift register shown in FIG. 5 will be illustrated below with reference to FIG. 6 and FIG. 7.

The power consumption-reducing sub-circuit 10 comprises a first transistor M1, a gate of the first transistor M1 is connected to the control terminal Ctr, a first electrode of the first transistor M1 is connected to the clock signal terminal CLK, a second electrode of the first transistor M1 is connected to the output sub-circuit 20.

The output sub-circuit 20 comprises a second transistor M2 and a voltage-stabilizing capacitance C, a gate of the second transistor M2 is connected to the pull-up node PU, a first electrode of the second transistor M2 is connected to the power consumption-reducing sub-circuit 10, a second electrode of the second transistor M2 is connected to the output terminal OUTPUT. An end of the voltage-stabilizing capacitance C is connected to the pull-up node PU, another end of the voltage-stabilizing capacitance C is connected to the output terminal OUTPUT.

It should be noted that the second electrode of the second transistor M2 is connected to the output terminal OUTPUT, i.e., directly connected to a gate line. Since a loading on the gate line is generally large, the second transistor M2 is generally the largest transistor with a width being thousands of micrometers or even tens of thousands of micrometers. A size of the first transistor M1 is much smaller than that of the second transistor M2. In an example, a width of the first transistor M1 may be around 100 micrometers.

The input sub-circuit 30 comprises a third transistor M3, a gate and a first electrode of the third transistor M3 are connected to the input terminal INPUT, a second electrode of the third transistor M3 is connected to the pull-up node PU.

The pull-down control sub-circuit 40 comprises a fourth transistor M4, a fifth transistor M5, a sixth transistor M6, and a seventh transistor M7; a gate and a first electrode of the fourth transistor M4 are connected to the first voltage terminal VDD, a second electrode of the fourth transistor M4 is connected to a gate of the fifth transistor M5 and a first electrode of the sixth transistor M6; a first electrode of the fifth transistor M5 is connected to the first voltage terminal VDD, a second electrode of the fifth transistor M5 is connected to the pull-down node PD and a first electrode of the seventh transistor M7; a gate of the sixth transistor M6 is connected to the pull-up node PU, a second electrode of the sixth transistor M6 is connected to the second voltage terminal VSS; a gate of the seventh transistor M7 is connected to the pull-up node PU, a second electrode of the seventh transistor M7 is connected to the second voltage terminal VSS.

The pull-down sub-circuit 50 comprises an eighth transistor M8 and a ninth transistor M9, a gate of the eighth transistor M8 is connected to the pull-down node PD, a first electrode of the eighth transistor M8 is connected to the pull-up node PU, a second electrode of the eighth transistor M8 is connected to the second voltage terminal VSS; a gate of the ninth transistor M9 is connected to the pull-down node PD, a first electrode of the ninth transistor M9 is connected to the output terminal OUTPUT, a second electrode of the ninth transistor M9 is connected to the second voltage terminal VSS.

The reset sub-circuit 60 comprises a tenth transistor M10, a gate of the tenth transistor M10 is connected to the reset signal terminal RESET, a first electrode of the tenth transistor M10 is connected to the pull-up node PU, a second electrode of the tenth transistor M10 is connected to the second voltage terminal VSS.

In an example, the reset sub-circuit 60 further comprises an eleventh transistor M11, a gate of the eleventh transistor M11 is connected to the reset signal terminal RESET, a first electrode of the eleventh transistor M11 is connected to the output terminal OUTPUT, a second electrode of the eleventh transistor M11 is connected to the second voltage terminal VSS.

It should be noted that each transistor in the embodiments of the present disclosure may be a N-type transistor. In this case, when the stage of shift registers is configured to output a gate scan signal, a high level is input to the control terminal Ctr of the stage of shift registers; of course, each transistor may also be a P-type transistor, and in this case, when the stage of shift registers is configured to output a gate scan signal, a low level is input to the control terminal Ctr of the stage of shift registers, such that the first transistor M1 is turned on, a signal of the clock signal terminal CLK may be output to the output terminal OUTPUT through the third transistor M3 as the gate scan signal. The embodiments of the present disclosure takes each transistor being a N-type transistor for example for illustration; and then, the first voltage terminal VDD outputs a constant high level, the second voltage terminal VSS outputs a constant low level.

An operation process of the shift register shown in FIG. 7 will be illustrated below with reference to the timing control diagram shown in FIG. 8, which comprises an input phase P1, an output phase P2, a reset phase P3.

It should be noted that when some stage of shift registers is configured to output a gate scan signal, in each of the above phases, a potential of the control terminal Ctr of the stage of shift registers is a high level, the first transistor M1 is always at an ON state, and then a signal of the clock signal terminal CLK may be output to the second transistor M2 through the first transistor M1.

The input phase P1: Ctr=1, INPUT=1, CLK=0, PU=1, PD=0, RESET=0, OUTPUT=0. The input sub-circuit 30 outputs a voltage of the input terminal INPUT to the pull-up node PU under the control of the input terminal INPUT. The pull-down control sub-circuit 40 outputs a voltage of the second voltage terminal VSS to the pull-down node PD under the control of the pull-up node PU.

In this case, under the control of the input terminal INPUT, the third transistor M3 is turned on, the voltage of the input terminal INPUT is output to the pull-up node PU through the third transistor M3. Under the control of the pull-up node PU, the second transistor M2 is turned on, the signal of the clock signal terminal CLK is output to the output terminal OUTPUT through the first transistor M1 and the second transistor M2. Since the signal of the clock signal terminal CLK is a low level in this phase, the output terminal OUTPUT does not output the gate scan signal.

Under the control of the first voltage terminal VDD, the fourth transistor M4 is turned on, a voltage of the first voltage terminal VDD is output to a node PDCN through the fourth transistor M4, and under the control of the node PDCN, the fifth transistor M5 is turned on, the voltage of the first voltage terminal VDD is output to the pull-down node PD through the fifth transistor M5; under the control of the pull-up node PU, the sixth transistor M6 and the seventh transistor M7 are turned on, the voltage of the second voltage terminal VSS is output to the pull-down node PD through the seventh transistor M7; by setting sizes of the fifth transistor M5 and the seventh transistor M7, a potential of the pull-down node PD is made to be the low level of the second voltage terminal. Under the control of the pull-down node PD, the eighth transistor M8 and the ninth transistor M9 are turned off. In addition, under the control of the reset signal terminal RESET, the tenth transistor M10 and the eleventh transistor M11 are turned off.

The output phase P2: Ctr=1, INPUT=0, CLK=1, PU=1, PD=0, RESET=0, OUTPUT=1. Under the control of the pull-up node PU, the output sub-circuit 20 outputs an output signal of the power consumption-reducing sub-circuit 10 to the output terminal OUTPUT.

In this case, under the control of the input terminal INPUT, the third transistor M3 is turned off; since a bootstrapping effect of the voltage-stabilizing capacitance C, the pull-up node PU keeps the high level. Under the control of the pull-up node PU, the second transistor M2 is maintained at an ON state, the high level of the clock signal terminal CLK is output to the output terminal OUTPUT as the gate scan signal. In this phase, the states of other transistors are same as those in the input phase P1.

The reset phase P3: Ctr=1, INPUT=0, CLK=0, PU=0, PD=1, RESET=1, OUTPUT=0. Under the control of the reset signal terminal RESET, the reset sub-circuit 60 outputs the voltage of the second voltage terminal VSS to the pull-up node PU. Under the control of the first voltage terminal VDD, the pull-down control sub-circuit 40 outputs the voltage of the first voltage terminal VDD to the pull-down node PD. Under the control of the pull-down node PD, the pull-down sub-circuit 50 outputs the voltage of the second voltage terminal VSS to the pull-up node PU and the output terminal OUTPUT.

In this case, under the control of the reset signal terminal RESET, the tenth transistor M10 is turned on, the voltage of the second voltage terminal VSS is output to the pull-up node PU through the tenth transistor M10. Under the control of the pull-up node PU, the third transistor M3, the sixth transistor M6, the seventh transistor M7 are turned off. At this time, the high level of the first voltage terminal VDD is output to the pull-down node PD through the fifth transistor M5. Under the control of the pull-down node PD, the eighth transistor M8 and the ninth transistor M9 are turned on, the low level of the second voltage terminal VSS is output to the pull-up node PU through the eighth transistor M8, and is output to the output terminal OUTPUT through the ninth transistor M9, so as to realize the reset of the pull-up node PU and the output terminal OUTPUT.

In an example, in the reset phase P3, the low level of the second voltage terminal VSS is further output to the output terminal OUTPUT through the eleventh transistor M11, so as to realize the further reset of the output terminal OUTPUT.

Next, prior to the start of a next frame of images, when the potential of the reset signal terminal RESET is a low level, under the control of the pull-down node PD, the output terminal OUTPUT maintains a low level through the ninth transistor M9, the pull-up node PU maintains a low level through the eighth transistor M8.

Figure 6:
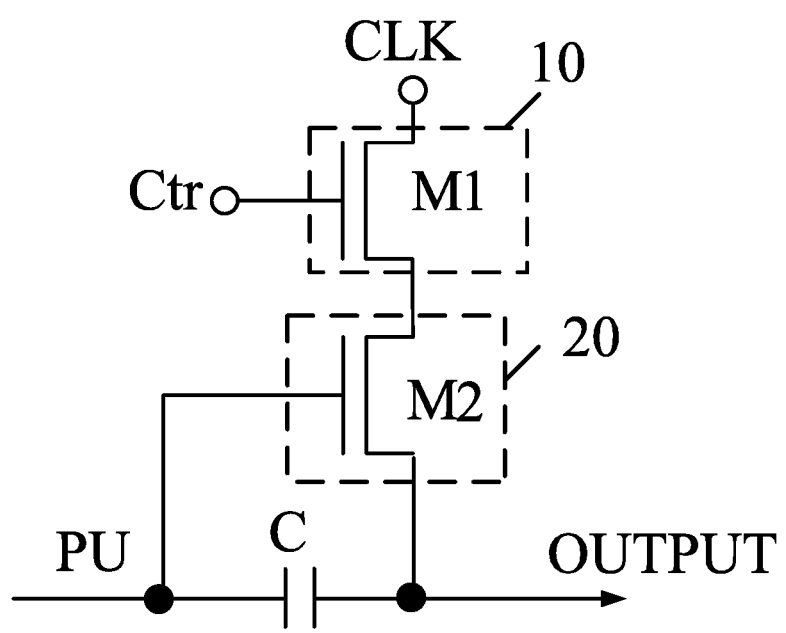
FIG. 6 is a circuit structure diagram of the shift register shown in FIG. 4.

The embodiments of the present disclosure provide a shift register comprising a first transistor M1, a second transistor M2, and a voltage-stabilizing capacitance C as shown in FIG. 6, in which:

A gate of the first transistor M1 is connected to a control terminal Ctr, a first electrode of the first transistor M1 is connected to a clock signal terminal CLK, and a second electrode of the first transistor M1 is connected to a first electrode of the second transistor M2, a gate of the second transistor M2 is connected to a pull-up node PU, a second electrode of the second transistor M2 is connected to an output terminal OUTPUT. An end of the voltage-stabilizing capacitance C is connected to the pull-up node PU, another end of the voltage-stabilizing capacitance C is connected to the output terminal OUTPUT.

It should be noted that the operation process and advantageous effects of the shift register shown in FIG. 6 have been illustrated in detail above, and are not repeatedly described here.

Figure 7:
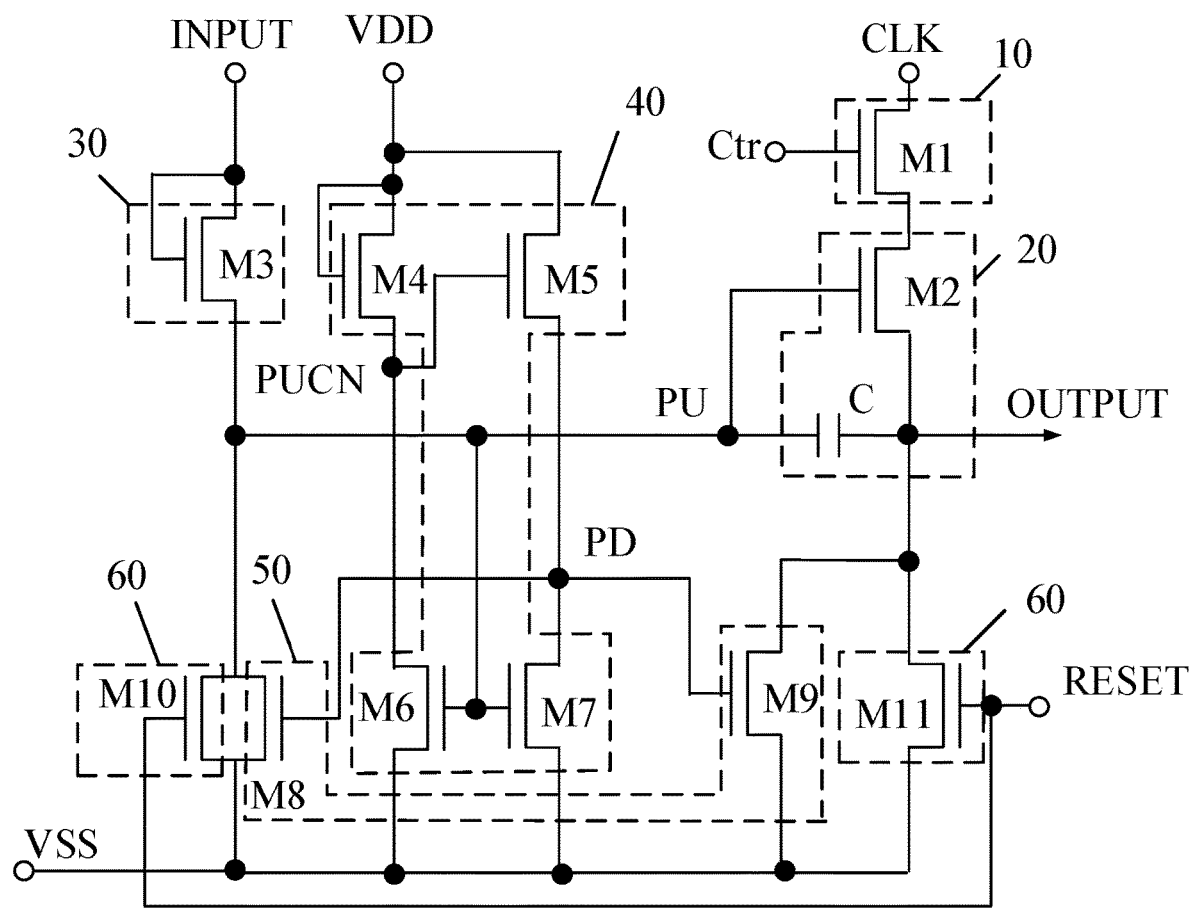
FIG. 7 is a circuit structure diagram of the shift register shown in FIG. 5.
Figure 8:
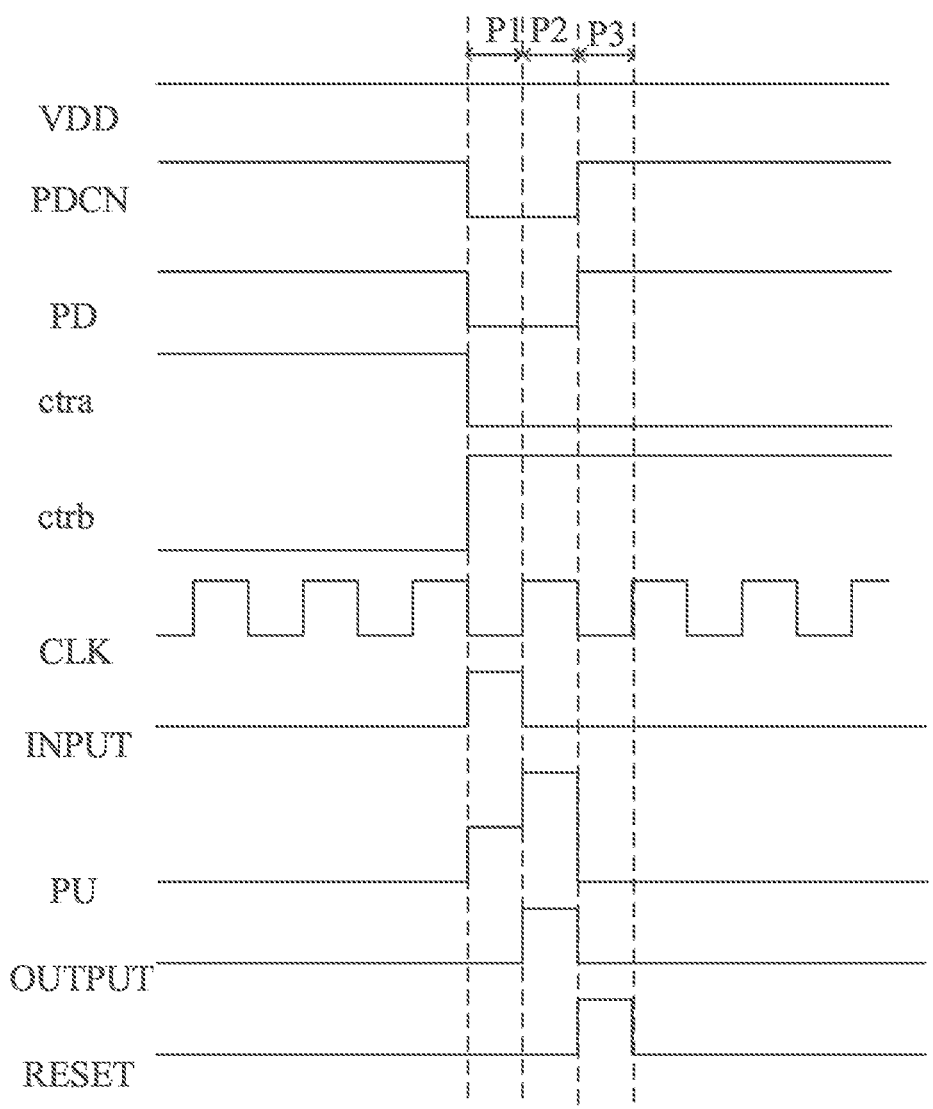
FIG. 8 is a timing control diagram of the shift register shown in FIG. 5.

On this basis, the above shift register may further comprise a third transistor M3, a fourth transistor M4, a fifth transistor M5, a sixth transistor M6, a seventh transistor M7, a eighth transistor M8, a ninth transistor M9, and a tenth transistor M10, as shown in FIG. 7. Wherein:

A gate and a first electrode of the third transistor M3 are connected to an input terminal INPUT, a second electrode of the third transistor M3 is connected to the pull-up node PU.

A gate and a first electrode of the fourth transistor M4 are connected to a first voltage terminal VDD, a second electrode of the fourth transistor M4 is connected to a gate of the fifth transistor M5 and a first electrode of the sixth transistor M6; a first electrode of the fifth transistor M5 is connected to the first voltage terminal VDD, a second electrode of the fifth transistor M5 is connected to a pull-down node PD and a first electrode of the seventh transistor M7; a gate of the sixth transistor M6 is connected to the pull-up node PU, a second electrode of the sixth transistor M6 is connected to a second voltage terminal VSS; a gate of the seventh transistor M7 is connected to the pull-up node PU, a second electrode of the seventh transistor M7 is connected to the second voltage terminal VSS.

A gate of the eighth transistor M8 is connected to the pull-down node PD, a first electrode of the eighth transistor M8 is connected to the pull-up node PU, a second electrode of the eighth transistor M8 is connected to the second voltage terminal VSS; a gate of the ninth transistor M9 is connected to the pull-down node PD, a first electrode of the ninth transistor M9 is connected to the output terminal OUTPUT, a second electrode of the ninth transistor M9 is connected to the second voltage terminal VSS.

A first electrode of the tenth transistor M10 is connected to the pull-up node PU, a second electrode of the tenth transistor M10 is connected to the second voltage terminal VSS.

It should be noted that the operation process of the shift register shown in FIG. 7 has been illustrated in detail by the foregoing embodiments and is not repeatedly described here.

In an example, the shift register provided by the embodiments of the present disclosure as shown in FIG. 7 may further comprise a eleventh transistor M11, a first electrode of the eleventh transistor M11 connected to the output terminal OUTPUT, a second electrode of the eleventh transistor M11 connected to the second voltage terminal VSS, so as to realize the further reset of the output terminal OUTPUT in the reset phase P3.

Figure 9:
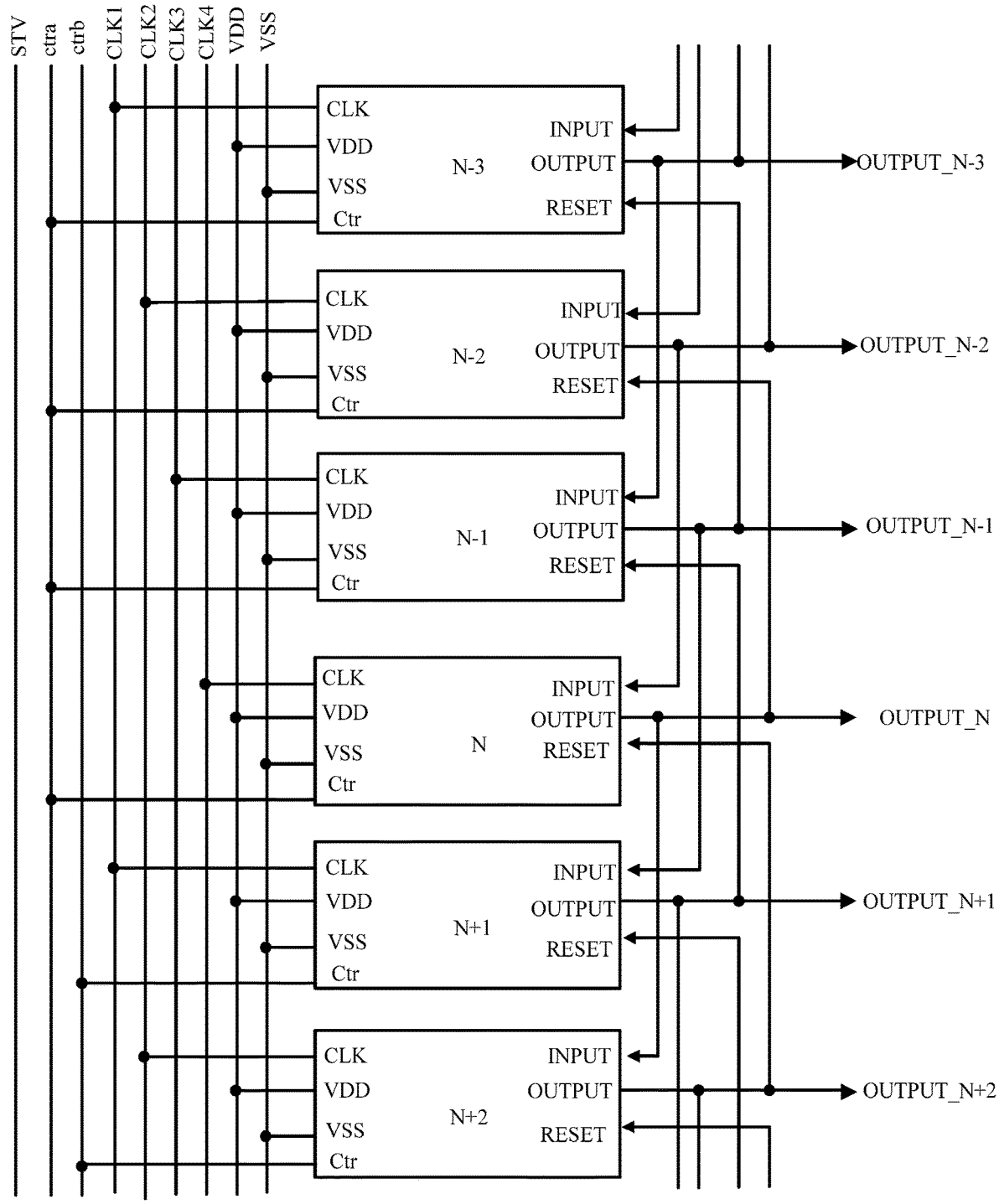
FIG. 9 is a structural diagram of a gate driving circuit formed by a plurality of the shift registers shown in FIG. 4 in cascade.

The embodiments of the present disclosure provide a gate driving circuit comprising a plurality of shift registers as described above in cascade. As shown in FIG. 9, a control terminal of at least one stage of shift registers is connected to a first control signal terminal ctra; a control terminal of at least one stage of the shift registers is connected to a second control signal terminal ctrb.

In view of this, in this gate driving circuit, it may be controlled whether to output a clock signal of the clock signal line to the output sub-circuit 20 through the power consumption-reducing sub-circuit 10 by selecting a control signal of the control terminal Ctr. In each stage of shift registers, the output sub-circuit 20 is connected to the clock signal terminal CLK through the power consumption-reducing sub-circuit 10, and the power consumption-reducing sub-circuit 10 is not connected with the output terminal OUTPUT, therefore, a size of a transistor constituting the power consumption-reducing sub-circuit 10 may be relatively small compared to that of a transistor constituting the output sub-circuit 20, and thus a gate-source capacitance $C_{gs}^1$ corresponding to the transistor constituting the power consumption-reducing sub-circuit 10 may be relatively small, such that a capacitance $C_{ck}$ on the clock signal line may be reduced; and according to a dynamic power consumption $P_{present}=f_{ck} \times C_{ck} \times V_{ck}^2$ of the clock signal line, it is clear that a reduced capacitance $C_{ck}$ on the clock signal line may result in a reduced dynamic power consumption P of the clock signal line, and then power consumption of the gate driving circuit may be reduced. Taking a clock signal of the gate driving circuit being 4CLK and a resolution of a display being 2m*2n for example, in the embodiments of the present disclosure, a capacitance of each clock signal line is $n \times C_{gs}^1/4 + n \times C_{gs}^2/4$, which is much smaller than the capacitance $2n \times C_{gs}^2/4$ of the clock signal line of the related gate driving circuit, and then $P_{present}$ of the clock signal line of the related gate driving circuit is much smaller than $P_{original}=f_{ck} \times C_{ck} \times V_{ck}^2$. Meanwhile, a frequency of an input signal of the control terminal Ctr is much smaller than a frequency of the clock signal CLK, thus the dynamic power consumption P of the clock signal line may be further reduced.

On this basis, in a case where the shift register comprises an input sub-circuit 30, a pull-down control sub-circuit 40, a pull-down sub-circuit 50, and a reset sub-circuit 60:

Input terminals of 1st through (N/2)th-stage shift registers are connected to a first signal terminal, except for the 1st through (N/2)th-stage shift registers, an input terminal INPUT of an Mth-stage shift register is connected to an output terminal OUTPUT of an (M–N/2)th-stage shift register.

Except for the last N/2 stages of shift registers, a reset signal terminal RESET of the Mth-stage shift register is connected to an output terminal OUTPUT of an (M+N/2) th-stage shift register, reset signal terminals RESET of the last N/2 stages of shift registers are connected to a second signal terminal, wherein N represents the number of clock signals within a clock period, the clock signals being clock signals input to the gate driving circuit, N is a positive even number, M is a positive integer.

Taking N=4 for example, as shown in FIG. 9, input terminals INPUT of first-stage and second-stage shift registers are connected to a first signal terminal, except for the first-stage and second-stage shift registers, an input terminal INPUT of an Mth-stage shift register is connected to an output terminal OUTPUT of an (M–2)th-stage shift register. Except for the last two stages of shift registers, a reset signal terminal RESET of the Mth-stage shift register is connected to an output terminal OUTPUT of an (M+2)th-stage shift register, reset signal terminals RESET of the last two stages of shift registers are connected to a second signal terminal.

In the embodiments of the present disclosure, a capacitance of each clock signal line is $X \times Cgs^1/4 + Y \times Cgs^2/4$. When the shift register is not configured to output a gate scan signal, a control voltage of the control terminal Ctr may be selected such that the above first transistor M1 is turned off. In order to further reduce the power consumption of the gate driving circuit, clock signals in other stages of shift registers except for shift registers that correspondingly output gate scan signals are not able to be output to the output sub-circuit 20 through the power consumption-reducing sub-circuit 10, then the above Y is reduced, such that the capacitance of each clock signal line is reduced and the power consumption of the gate driving circuit may be reduced.

Those skilled in the art may understand that the required wirings increase as the control signal terminals connected with the above gate driving circuit increase, which would increase the fabricating costs of the gate driving circuit. To solve this problem, in an example, control terminals Ctr of individual stages of shift registers of an upper half of the gate driving circuit are connected to the first control signal terminal ctra, control terminals Ctr of individual stages of shift registers of a lower half of the gate driving circuit are connected to the second control signal terminal ctrb. In this case, signals of the first control signal terminal ctra and the second control signal terminal ctrb are reciprocal signals, whose period is one frame.

It should be noted that the gate driving circuit generally comprises an even number of stages of shift registers, thus a number of individual stages of shift registers of the upper half is equal to a number of individual stages of shift registers of the lower half. For example, when the gate driving circuit comprises four stages of shift registers, individual stages of shift registers of the upper half may refer to 1st and 2nd-stage shift registers, individual stages of shift registers of the lower half may refer to 3rd and 4th-stage shift registers.

The embodiments of the present disclosure further provides a display apparatus comprising any of the above-described gate driving circuits which has same structure and advantageous effects as those of the gate driving circuits provided by the foregoing embodiments. The structure and the advantageous effects of the gate driving circuits have been illustrated in detail by the foregoing embodiments and thus are not repeatedly described here.

The above is merely the detailed embodiments of the present disclosure, but the protection scope of the present disclosure is not limited to this. Any variation or replacement that the skilled people familiar with the art can easily envisage within the technical range revealed by the present disclosure shall be encompassed within the protection scope of the present disclosure. Therefore, the protection scope of the present disclosure shall be the protection scope of the claims.

What is claimed is:
1. A shift register comprising:
   a power consumption-reducing sub-circuit and an output sub-circuit; wherein:
   the power consumption-reducing sub-circuit is connected to a clock signal terminal, the clock signal terminal is connected to a clock signal line, a control terminal, and the output sub-circuit,
   the power consumption-reducing sub-circuit is configured to output a signal of the clock signal terminal to the output sub-circuit under control of the control terminal; and
   the output sub-circuit is connected to the clock signal terminal through the power consumption-reducing sub-circuit and is also connected to an output terminal and a pull-up node,
   the output sub-circuit is configured to output an output signal of the power consumption-reducing sub-circuit to the output terminal under control of the pull-up node; wherein:
   the power consumption-reducing sub-circuit comprises a first transistor, a gate of the first transistor is connected to the control terminal, a first electrode of the first transistor is connected to the clock signal terminal, and a second electrode of the first transistor is connected to the output sub-circuit;

the output sub-circuit comprises a voltage-stabilizing capacitance and a second transistor, a gate of the second transistor is connected to the pull-up node, a first electrode of the second transistor is connected to the power consumption-reducing sub-circuit, a second electrode of the second transistor is connected to the output terminal, an end of the voltage-stabilizing capacitance is connected to the pull-up node, another end of the voltage-stabilizing capacitance is connected to the output terminal; and a size of the first transistor is smaller than a size of the second transistor, thereby reducing gate-source capacitance corresponding to the first transistor and thus reducing power consumption of the clock signal line.

2. The shift register of claim 1, further comprising an input sub-circuit, a pull-down control sub-circuit, a pull-down sub-circuit, and a reset sub-circuit; wherein:

the input sub-circuit is connected to an input terminal and the pull-up node, the input sub-circuit is configured to output a voltage of the input terminal to the pull-up node under control of the input terminal;

the pull-down control sub-circuit is connected to a first voltage terminal, a second voltage terminal, the pull-up node, and a pull-down node, the pull-down control sub-circuit is configured to output a voltage of the first voltage terminal to the pull-down node under control of the first voltage terminal, or is configured to output a voltage of the second voltage terminal to the pull-down node under control of the pull-up node;

the pull-down sub-circuit is connected to the pull-up node, the pull-down node, the output terminal, and the second voltage terminal, the pull-down sub-circuit is configured to output a voltage of the second voltage terminal to the pull-up node and the output terminal under the control of the pull-down node; and the reset sub-circuit is connected to a reset signal terminal, the second voltage terminal, and the pull-up node, the reset sub-circuit is configured to output a voltage of the second voltage terminal to the pull-up node under control of the reset signal terminal.

3. The shift register of claim 2, wherein the reset sub-circuit is further connected to the output terminal, the reset sub-circuit is further configured to output a voltage of the second voltage terminal to the output terminal under the control of the reset signal terminal.

4. The shift register of claim 2, wherein:

the input sub-circuit comprises a third transistor, a gate and a first electrode of the third transistor are connected to the input terminal, a second electrode of the third transistor is connected to the pull-up node.

5. A gate driving circuit comprising:

a plurality of the shift registers of claim 1 in cascade; wherein:

a control terminal of at least one stage of the shift registers is connected to a first control signal terminal; and a control terminal of at least one stage of the shift registers is connected to a second control signal terminal.

6. The gate driving circuit of claim 5, wherein in a case where the shift register comprises the input sub-circuit, the pull-down control sub-circuit, the pull-down sub-circuit, and the reset sub-circuit, input terminals of 1st through (N/2)th-stage shift registers are connected to a first signal terminal, except for the 1st through (N/2)th-stage shift registers, an input terminal of an Mth-stage shift register is connected to an output terminal of an (M−N/2)th-stage shift register;

except for the last N/2 stages of shift registers, a reset signal terminal of the Mth-stage shift register is connected to an output terminal of an (M+N/2)th-stage shift register, reset signal terminals of the last N/2 stages of shift registers are connected to a second signal terminal, wherein N represents the number of clock signals within a clock period, the number of clock signals being clock signals input to the gate driving circuit, N is a positive even number, M is a positive integer.

7. The gate driving circuit of claim 5, wherein:

control terminals of individual stages of shift registers of an upper half of the gate driving circuit are connected to the first control signal terminal, and control terminals of individual stages of shift registers of a lower half of the gate driving circuit are connected to the second control signal terminal.

8. A display apparatus comprising the gate driving circuit of claim 5.

9. A shift register, comprising:

a power consumption-reducing sub-circuit and an output sub-circuit; wherein:

the power consumption-reducing sub-circuit is connected to a clock signal terminal, a control terminal, and the output sub-circuit, the power consumption-reducing sub-circuit is configured to output a signal of the clock signal terminal to the output sub-circuit under control of the control terminal; and the output sub-circuit is connected to the clock signal terminal through the power consumption-reducing sub-circuit and is also connected to an output terminal and a pull-up node, the output sub-circuit is configured to output an output signal of the power consumption-reducing sub-circuit to the output terminal under control of the pull-up node; wherein:

the power consumption-reducing sub-circuit comprises a first transistor, a gate of the first transistor is connected to the control terminal, a first electrode of the first transistor is connected to the clock signal terminal, and a second electrode of the first transistor is connected to the output sub-circuit;

the output sub-circuit comprises a voltage-stabilizing capacitance and a second transistor, a gate of the second transistor is connected to the pull-up node, a first electrode of the second transistor is connected to the power consumption-reducing sub-circuit, a second electrode of the second transistor is connected to the output terminal, an end of the voltage-stabilizing capacitance is connected to the pull-up node, another end of the voltage-stabilizing capacitance is connected to the output terminal; and a size of the first transistor is smaller than a size of the second transistor, the shift register of claim 1, further comprising an input sub-circuit, a pull-down control sub-circuit, a pull-down sub-circuit, and a reset sub-circuit; wherein:

the input sub-circuit is connected to an input terminal and the pull-up node, the input sub-circuit is configured to output a voltage of the input terminal to the pull-up node under control of the input terminal;

the pull-down control sub-circuit is connected to a first voltage terminal, a second voltage terminal, the pull-up node, and a pull-down node, the pull-down control sub-circuit is configured to output a voltage of the first voltage terminal to the pull-down node under control of the first voltage terminal, or is configured to output a voltage of the second voltage terminal to the pull-down node under control of the pull-up node;

the pull-down sub-circuit is connected to the pull-up node, the pull-down node, the output terminal, and the second voltage terminal, the pull-down sub-circuit is configured to output a voltage of the second voltage terminal to the pull-up node and the output terminal under the control of the pull-down node; and the reset sub-circuit is connected to a reset signal terminal, the second voltage terminal, and the pull-up node, the reset sub-circuit is configured to output a voltage of the second voltage terminal to the pull-up node under control of the reset signal terminal, wherein:

the pull-down control sub-circuit comprises a fourth transistor, a fifth transistor, a sixth transistor, and a seventh transistor;

a gate and a first electrode of the fourth transistor are connected to the first voltage terminal, a second electrode of the fourth transistor is connected to a gate of the fifth transistor and a first electrode of the sixth transistor;

a first electrode of the fifth transistor is connected to the first voltage terminal, a second electrode of the fifth transistor is connected to the pull-down node and a first electrode of the seventh transistor;

a gate of the sixth transistor is connected to the pull-up node, a second electrode of the sixth transistor is connected to the second voltage terminal; and a gate of the seventh transistor is connected to the pull-up node, a second electrode of the seventh transistor is connected to the second voltage terminal.

10. The shift register of claim 9, wherein the pull-down sub-circuit comprises an eighth transistor and a ninth transistor, a gate of the eighth transistor is connected to the pull-down node, a first electrode of the eighth transistor is connected to the pull-up node, a second electrode of the eighth transistor is connected to the second voltage terminal; a gate of the ninth transistor is connected to the pull-down node, a first electrode of the ninth transistor is connected to the output terminal, a second electrode of the ninth transistor is connected to the second voltage terminal.

11. The shift register of claim 9, wherein the reset sub-circuit comprises a tenth transistor, a gate of the tenth transistor is connected to the reset signal terminal, a first electrode of the tenth transistor is connected to the pull-up node, a second electrode of the tenth transistor is connected to the second voltage terminal.

12. The shift register of claim 11, wherein the reset sub-circuit further comprises an eleventh transistor, a gate of the eleventh transistor is connected to the reset signal terminal, a first electrode of the eleventh transistor is connected to the output terminal, a second electrode of the eleventh transistor is connected to the second voltage terminal.

13. A gate driving circuit comprising:

a plurality of the shift registers of claim 9 in cascade; wherein:

a control terminal of at least one stage of the shift registers is connected to a first control signal terminal; and a control terminal of at least one stage of the shift registers is connected to a second control signal terminal.

14. The gate driving circuit of claim 13, wherein in a case where the shift register comprises the input sub-circuit, the pull-down control sub-circuit, the pull-down sub-circuit, and the reset sub-circuit, input terminals of 1st through (N/2)th-stage shift registers are connected to a first signal terminal, except for the 1st through (N/2)th-stage shift registers, an input terminal of an Mth-stage shift register is connected to an output terminal of an (M−N/2)th-stage shift register;

except for the last N/2 stages of shift registers, a reset signal terminal of the Mth-stage shift register is connected to an output terminal of an (M+N/2)th-stage shift register, reset signal terminals of the last N/2 stages of shift registers are connected to a second signal terminal, wherein N represents the number of clock signals within a clock period, the number of clock signals being clock signals input to the gate driving circuit, N is a positive even number, M is a positive integer.

15. A shift register comprising a first transistor, a second transistor, and a voltage-stabilizing capacitance; wherein:

a gate of the first transistor is connected to a control terminal, a first electrode of the first transistor is connected to a clock signal terminal, the clock signal terminal is connected to a clock signal line, a second electrode of the first transistor is connected to a first electrode of the second transistor;

a gate of the second transistor is connected to a pull-up node, a second electrode of the second transistor is connected to an output terminal; and an end of the voltage-stabilizing capacitance is connected to the pull-up node, another end of the voltage-stabilizing capacitance is connected to the output terminal;

wherein:

a size of the first transistor is smaller than a size of the second transistor, thereby reducing gate-source capacitance corresponding to the first transistor and thus reducing power consumption of the clock signal line.

16. The shift register of claim 11, further comprising a third transistor, a fourth transistor, a fifth transistor, a sixth transistor, a seventh transistor, an eighth transistor, a ninth transistor, and a tenth transistor; wherein:

a gate and a first electrode of the third transistor are connected to an input terminal, a second electrode of the third transistor is connected to the pull-up node;

a gate and a first electrode of the fourth transistor are connected to a first voltage terminal, a second electrode of the fourth transistor is connected to a gate of the fifth transistor and a first electrode of the sixth transistor;

a first electrode of the fifth transistor is connected to the first voltage terminal, a second electrode of the fifth transistor is connected to a pull-down node and a first electrode of the seventh transistor;

a gate of the sixth transistor is connected to the pull-up node, a second electrode of the sixth transistor is connected to a second voltage terminal;

a gate of the seventh transistor is connected to the pull-up node, a second electrode of the seventh transistor is connected to the second voltage terminal;

a gate of the eighth transistor is connected to the pull-down node, a first electrode of the eighth transistor is connected to the pull-up node, a second electrode of the eighth transistor is connected to the second voltage terminal;

a gate of the ninth transistor is connected to the pull-down node, a first electrode of the ninth transistor is connected to the output terminal, a second electrode of the ninth transistor is connected to the second voltage terminal; and a gate of the tenth transistor is connected to a reset signal terminal, a first electrode of the tenth transistor is connected to the pull-up node, a second electrode of the tenth transistor is connected to the second voltage terminal.

17. The shift register of claim 16, further comprising an eleventh transistor, a gate of the eleventh transistor is connected to the reset signal terminal, a first electrode of the eleventh transistor is connected to the output terminal, a second electrode of the eleventh transistor is connected to the second voltage terminal.

18. A gate driving circuit comprising:
the shift registers of claim 15, wherein:
a control terminal of at least one stage of the shift registers is connected to a first control signal terminal;
a control terminal of at least one stage of the shift registers is connected to a second control signal terminal.

19. The gate driving circuit of claim 18, wherein control terminals of individual stages of shift registers of an upper half of the gate driving circuit are connected to the first control signal terminal, and control terminals of individual stages of shift registers of a lower half of the gate driving circuit are connected to the second control signal terminal.

* * * * *